United States Patent [19]

Yu

[11] Patent Number: 5,395,799
[45] Date of Patent: Mar. 7, 1995

[54] METHOD OF FABRICATING SEMICONDUCTOR DEVICES HAVING ELECTRODES COMPRISING LAYERS OF DOPED TUNGSTEN DISILICIDE

[75] Inventor: Chen-Hua D. Yu, Allentown, Pa.

[73] Assignee: AT&T Corp., Murray Hill, N.J.

[21] Appl. No.: 131,508

[22] Filed: Oct. 4, 1993

[51] Int. Cl.$^6$ ............... H01L 21/283; H01L 21/335
[52] U.S. Cl. ................................. 437/200; 437/34; 437/56; 437/193; 148/DIG. 106; 148/DIG. 147
[58] Field of Search .............. 437/200, 193, 56, 57, 437/58, 34; 148/DIG. 106, DIG. 147

[56] References Cited

U.S. PATENT DOCUMENTS

| | | | |
|---|---|---|---|
| 4,613,885 | 9/1986 | Haken | 437/57 |
| 4,755,478 | 7/1988 | Abernathey et al. | 437/41 |
| 4,859,278 | 8/1989 | Choi | 156/643 |
| 5,013,686 | 5/1991 | Choi et al. | 437/194 |
| 5,086,017 | 2/1992 | Lu | 437/200 |
| 5,132,234 | 7/1992 | Kim et al. | 437/31 |
| 5,278,096 | 1/1994 | Lee et al. | 437/162 |

OTHER PUBLICATIONS

Nygren, S., et al., "Dual-Type CMOS Gate Electrodes . . . ," *IEEE Trans. Elect. Devices,* vol. 36, No. 6, Jun. 1989, pp. 1087-1093.

Wolf et al., Silicon Processing, 1986, Lattice Press, vol. 1, pp. 181, 182, 384-399, 429-434, 565-568.

*Primary Examiner*—T. N. Quach

[57] ABSTRACT

A workpiece is formed comprising a silicon substrate covered by four successive layers of silicon dioxide, undoped polysilicon, undoped WSi$_2$ and a top layer of silicon dioxide on silicon nitride. The four layers are patterned to provide gate electrode structures each comprising the four layers. The workpiece is covered with a masking layer and the top layer of each structure is exposed through the masking layer. The top layers are then removed and ions of one conductivity type are implanted into the WSi$_2$ layers of one group of gate electrode structures while another group of structures is masked, and ions of the other conductivity type are implanted into the WSi$_2$ layers of the second group while the first group is masked. Thereafter, doped regions are formed in the substrate adjacent to the gate electrode structures.

15 Claims, 4 Drawing Sheets

METHOD OF FABRICATING SEMICONDUCTOR DEVICES HAVING ELECTRODES COMPRISING LAYERS OF DOPED TUNGSTEN DISILICIDE

BACKGROUND OF THE INVENTION

This invention relates to semiconductor devices, and particularly to a method of fabricating electrodes of such devices comprising layers of doped tungsten disilicide.

Various types of semiconductor devices, e.g., MOS devices, include electrodes formed from doped layers of polysilicon. Some of the layers are doped with N type impurities and others with P type impurities. The dopants greatly increase the electrical conductivity of the polysilicon. One prior art practice is to form a continuous layer of polysilicon and to implant ions of one type impurity into first portions of the layer while second portions of the layer are masked. Thereafter, the second portions are unmasked, and ions of the other type impurity are implanted into the second portions while the first portions are masked.

One problem with this process, particularly when used in the fabrication of gate electrodes overlying a thin oxide layer (formed on a surface of a semiconductor substrate), is that it is difficult to control the doping process for obtaining complete doping of the polysilicon layers while preventing penetration of the implanted ions into the underlying gate oxide layer.

A solution to this problem is to provide a layer of tungsten disilicide ($WSi_2$) covering the polysilicon layer and to selectively implant the various ions into different portions of the $WSi_2$ layer. $WSi_2$ is an effective barrier against implanted ions whereby, using high energies and high ion concentrations, relatively large quantities of ions can be implanted into the $WSi_2$ layer in short periods of time (desirable for reducing processing time), with no ions penetrating through the $WSi_2$ and polysilicon layers into the underlying gate oxide layer. After the ion implantation processes, the semiconductor workpiece is annealed for diffusing the impurities in each portion of the $WSi_2$ layer into the underlying polysilicon layer to form the differently doped polysilicon portions. Such annealing can be carefully controlled, whereby proper doping of the polysilicon portions occur with no significant penetration of the dopants into the gate oxide layer.

As above-explained, the ion implantation of the $WSi_2$ layer is done selectively, using various masking layers, whereby different portions of the continuous layer of $WSi_2$ are differently doped. Thereafter, the doping masking layers are removed and a new masking layer is applied which is patterned to expose those portions of the $WSi_2$ layer which have not been doped during the ion implantation process. The new mask is then used as an etching mask in a process of selectively etching away the exposed, undoped portions of the $WSi_2$ layer. The thus patterned $WSi_2$ layer is then used as an etching mask for selectively patterning the underlying polysilicon layer, which is used, in turn, as an etching mask for selectively patterning the underlying gate oxide layer. The resulting patterned structures are the gate electrode structures of MOS devices subsequently to be formed in the semiconductor substrate.

However, another problem exists. Prior to the above-described selective patterning of the $WSi_2$ layer, different portions of the layer had been doped with different conductivity type dopants for providing, eventually, two groups of gate electrode structures; one group being of N type conductivity and the other group being of P type conductivity. During the patterning process, during which holes or openings are formed through the $WSi_2$ layer, the sides of the openings expose portions of the $WSi_2$ layer which have been previously doped. The etching characteristics of $WSi_2$, however, are a function of the doping thereof, with P type doped $WSi_2$ having slightly different etching characteristics (in a given etching process) than N type doped $WSi_2$. Thus, if the etching parameters are selected to provide optimum etching (in terms of minimum line widths and side surface contours) of one doped type of $WSi_2$, the other doped type is not optimally etched. This results in at least one group of MOS devices having less than optimal structure and characteristics and degrades the quality of the semiconductor devices being made.

The present invention solves this problem.

SUMMARY OF THE INVENTION

In accordance with this invention, a semiconductor substrate is first formed having, on a surface thereof, successive continuous layers of a first layer of gate oxide, a second layer of polysilicon, a third layer of tungsten disilicide ($WSi_2$) and a fourth layer of a masking material, preferably either silicon dioxide or silicon nitride. The $WSi_2$ layer is undoped and, without first doping it, the successive layers are patterned, preferably by means of a known self-aligning patterning process, to provide spaced apart gate electrode structures on the substrate surface. Each gate electrode structure comprises the four layers enumerated, with the surface of the substrate between the gate structures being exposed.

Then, the entire surface of the workpiece is covered with a masking layer which is thereafter etched to remove only a thickness thereof sufficient to expose surface portions of the fourth layer of the gate structures while leaving the masking layer intact over the remaining portions of the semiconductor workpiece. The exposed fourth layer of each gate structure is then etched away exposing the surface of the underlying third layer of $WSi_2$. Then, while covering the otherwise exposed $WSi_2$ layers of a first group of gate structures with a masking layer, ions of one type of conductivity are implanted into the $WSi_2$ layer of a second group of gate structures. The process is thereafter repeated for implanting ions of the other type of conductivity into the $WSi_2$ layers of the first group of gate structures while the second group is masked.

DESCRIPTION OF PREFERRED EMBODIMENTS OF THE INVENTION

Figure 1:
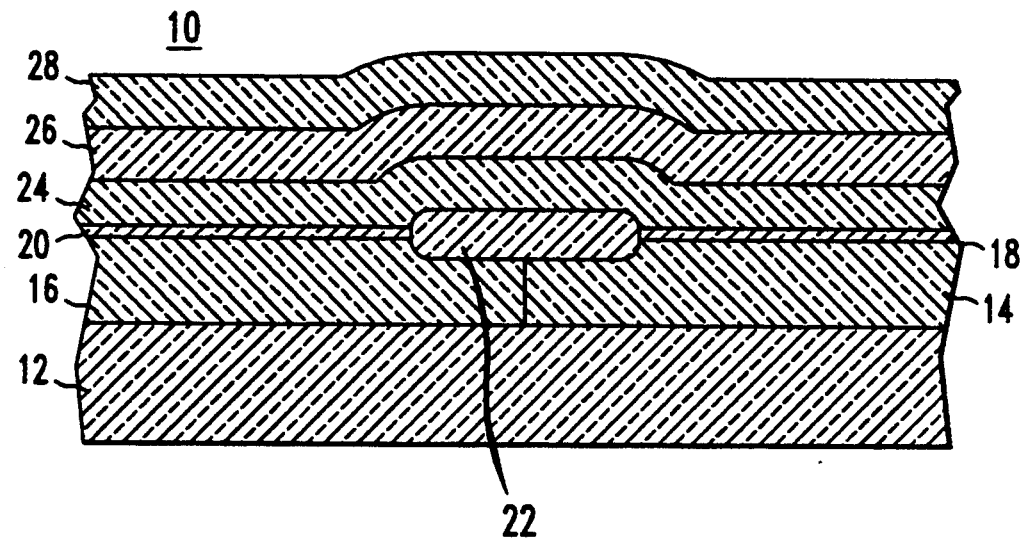
FIGS. 1–9 are schematic, cross-sectional views of a portion of a semiconductor workpiece illustrating the workpiece at successive steps in the fabrication of MOS devices in accordance with this invention.

FIG. 1 shows a semiconductor workpiece 10 conventionally used in the fabrication of MOS devices. The workpiece comprises a silicon substrate 12 including a P type well or tub 14 and an N type well or tub 16. The surface 18 of the substrate 12 is covered with layers 20 and 22 of silicon dioxide. The layer 20 is quite thin, e.g., 100 Angstroms, and forms, within the completed semiconductor device, the dielectric layer underlying the gate electrode of MOS devices to be formed. The layer 22 is much thicker, e.g., 5,000 Angstroms, and forms the field oxide providing electrical isolation between adjacent electrical components formed within the substrate 12 along the surface 18 thereof.

Overlying the oxide layers 20 and 22 is a continuous layer 24 of undoped polysilicon covered, in turn, by a layer 26 of undoped tungsten disilicide ($WSi_2$).

To the extent described so far, the workpiece 10 is of conventional design made using known processing steps. By way of example, the oxide layers 20 and 22 can be formed by thermal oxidizing processes (including appropriate masking to form the separate layers 20 and 22); the polysilicon layer 24 can be formed by Low Pressure Chemical Vapor Deposition (LPCVD); and the $WSi_2$ layer 26 can be similarly formed or by sputtering.

Thereafter, in accordance with the invention, the workpiece 10 is covered with a continuous layer 28 of a masking material, e.g., silicon dioxide or silicon nitride, each having a thickness of around 1,000–2,000 Angstroms. Known deposition processes, e.g., Plasma Enhanced Chemical Vapor Deposition (PECVD) can be used for both materials (whichever one used).

Figure 4:
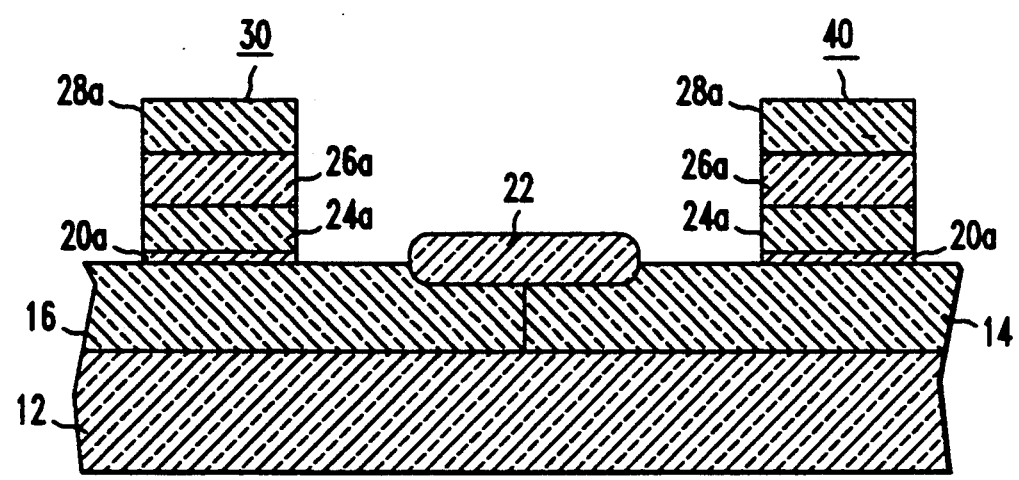

The various layers on the substrate 12 are thereafter patterned to form gate electrode structures 30 and 40 such as shown in FIG. 4. Only two such structures 30 and 40 are illustrated, but, in actual practice, a large number of such structures would be made on each substrate workpiece.

Figure 2:
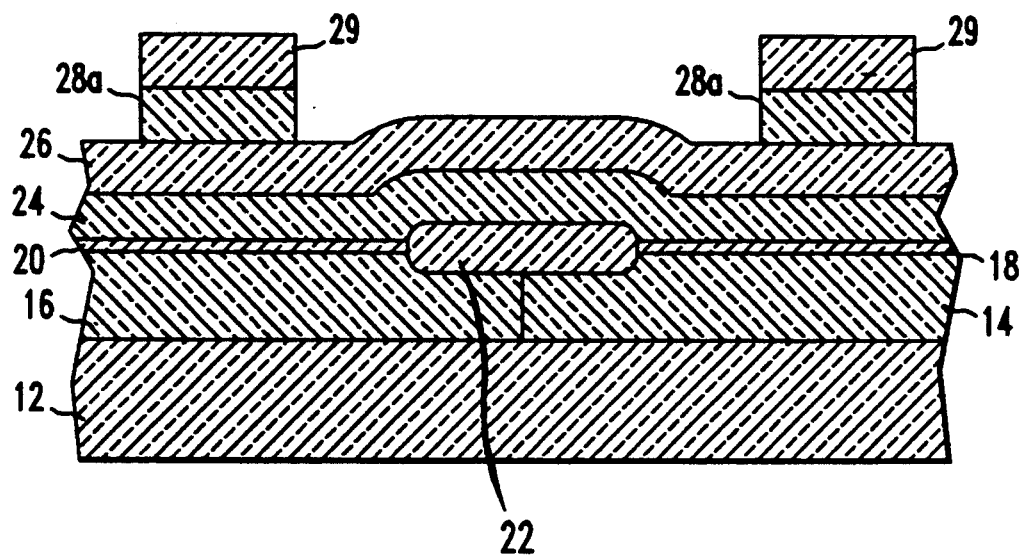
Figure 3:
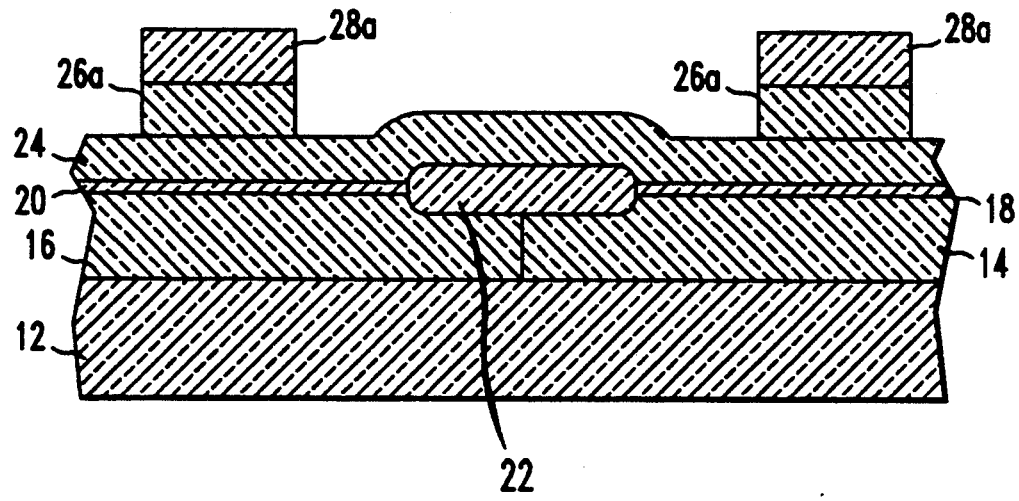

A detailed description of how the gate electrode structures are formed is not provided because various suitable processes are well known. Briefly, however, and by way of example, the gate electrode structures can be made using known dry etching processes wherein, starting with a patterned photomask 29 (FIG. 2), the upper layer 28 is selectively etched to form the upper layers 28a of the eventually formed (FIG. 4) gate electrode structures 30 and 40. The photomask 29 is then removed, and the upper layers 28a are then used as etch masks for patterning the underlying $WSi_2$ layer 26 into the layers 26a (FIG. 3) of the gate electrode structures. Then, the formed $WSi_2$ layers 26a are used as etch masks for patterning the underlying polysilicon layer 24 into the layers 24a (FIG. 4) which are then used as etch masks for patterning the underlying gate oxide layer 20 into the layers 20a. During the patterning of the gate oxide layer 20a, the field oxide layer 22 is not masked because of its large thickness relative to the gate oxide layer 20. That is, a substantial thickness of the field oxide layer 22 remains even after etching away a thickness thereof equal to that of the gate oxide layer 20.

The aforedescribed process, incorporating a "self-alignment" feature, is known. Of significance, however, is that during the etch patterning of the $WSi_2$ layer 26, the layer 26 is covered with a masking layer 28a of silicon dioxide or silicon nitride rather than a mask of a photoresist material as is conventionally used. Both silicon nitride and silicon dioxide provide better etch masking of $WSi_2$ then conventional photoresist materials, hence better definition, in terms of minimum line widths and vertical side walls, of the $WSi_2$ layers 26a is obtainable.

Of additional significance is that, during the etch patterning of the $WSi_2$ layer 26 (FIG. 2), the $WSi_2$ is not yet doped. As previously explained, in the prior art, the $WSi_2$ layer is first doped while it comprises a continuous layer overlying the substrate workpiece. An advantage of this is that, because $WSi_2$ is effective as a barrier against ions, the doping of the $WSi_2$ layer can be done using large ion doses and high implantation energies. The ions can thus be implanted quite quickly, thereby greatly reducing the expense of the process. Also, little risk exists that the ion will penetrate into the underlying gate oxide layer.

A problem, however, as previously explained, is that the later patterning of the $WSi_2$ is made more difficult owing to the presence of the different dopants in the $WSi_2$ layer. In the process according to the present invention, however, the patterning of the $WSi_2$ layer 26 (FIG. 2) is done while the $WSi_2$ layer is undoped. Thus, better definition of the patterned layers 26a is obtainable. How the patterned layers 26a are eventually doped, while preventing unwanted doping of other portions of the workpiece is described hereinafter.

In a next step (FIG. 5), the entire workpiece 10 is covered with a masking layer 42. If the upper masking layers 28a of the gate electrode structures 30 and 40 are of silicon dioxide, the preferred material of the masking layer 42 is a known photoresist, e.g., Shipley, No. 513L. If the upper layers 28a are of silicon nitride, the masking layer 42 can be either of the aforementioned photoresist or a layer of glass, e.g., silicon dioxide. In either case, the masking layer 42 is preferably applied by known "spin-on" processes.

Figure 5:
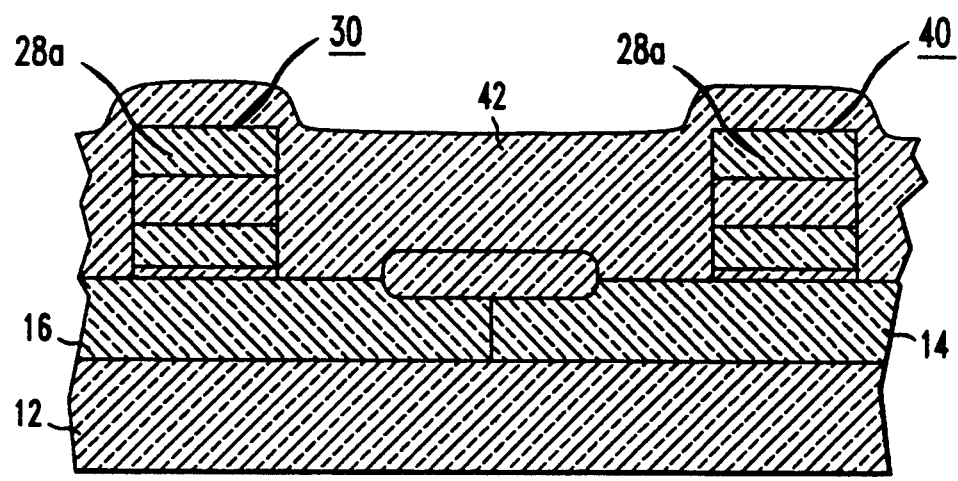

As shown in FIG. 5, the thickness of the masking layer 42 is much greater over the substrate surface areas between the gate electrode structures 30 and 40 than over the gate electrode structures. This occurs naturally during the spin-on processes wherein "spun-on" fluids (e.g., a powder of $SiO_2$ in a suitable binder) at least partially flow into any cavities on the workpiece surface to form layers having relatively flat upper surfaces.

Figure 6:
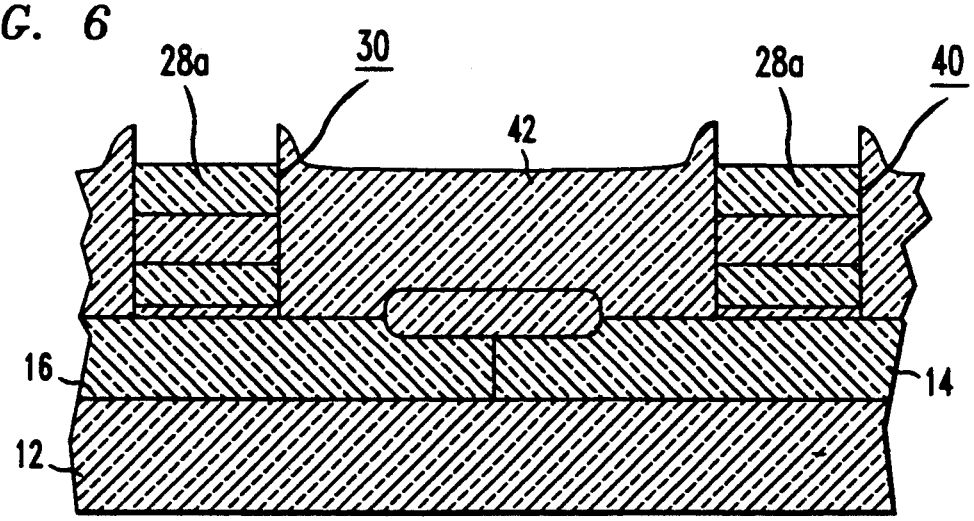

Then (FIG. 6), the masking layer 42 is partially etched away to expose upper surface portions of the upper layers 28a of the gate electrode structures 30 and 40. This is preferably done using a known reactive ion etching process which is self-stopping. That is, during the etching process, the composition of the plasma surrounding the workpiece is monitored. Then, when silicon oxide or silicon nitride is first detected, resulting from the beginning of etching of the exposed surface portions of the upper layers 28a (either of silicon dioxide or silicon nitride), the process is stopped. The process is quite sensitive, whereby little etching of the upper layers 28a occurs.

Figure 7:
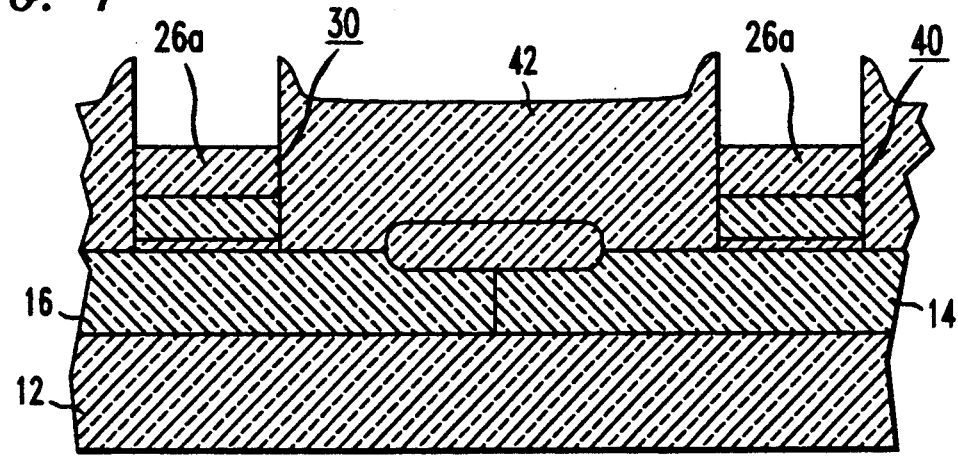

Thereafter (FIG. 7), the upper layers 28a are completely removed. With upper layers 28a of silicon dioxide, selective etching is preferably done using an etchant of dilute hydrofluoric acid, e.g., 100:1 water to HF. With upper layers 28a of silicon nitride, etching is preferably done using hot (e.g., 165° C.) phosphoric acid ($H_2PO_4$). Selection etching of both materials can also be done by known plasma reaction ion etching.

The next step, if the masking layer 42 is of a photoresist material, is to heat the workpiece to bake and "harden" the photoresist layer 42, e.g., at a temperature of 150° C. in a non-oxidizing atmosphere. Such hardening of photoresist layers is known and is done to make the layers more resistant to removal by etchants, whereby selective patterning of overlying photoresist layers can be performed without patterning of the "hardened" layer.

If the masking layer 42 is of spun-on glass, such extra baking is not necessary.

Figure 8:
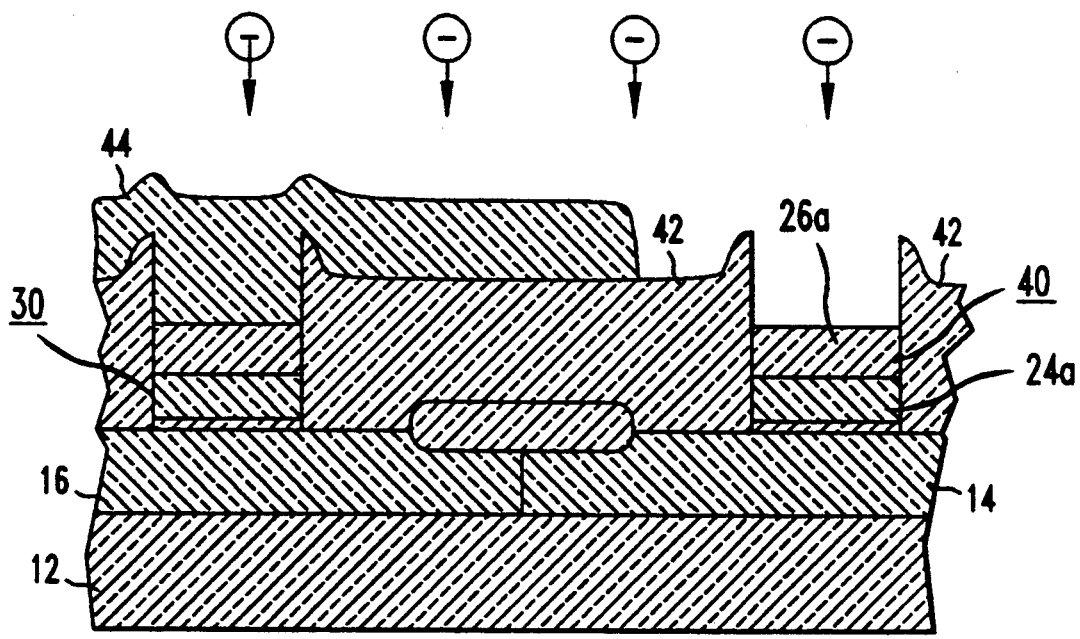

Then, as shown in FIG. 8, the next step is to cover the entire workpiece with a continuous layer of a photoresist, e.g., the aforementioned Shipley, No. 513L, and to pattern the continuous layer to form a masking layer 44. The layer 44 covers the electrode structure 30 while exposing the WSi$_2$ layer 26a of the other gate electrode structure 40. As previously indicated, the masking layer 42, either of "hardened" photoresist or spun-on glass, remains in place beneath selectively etched away portions of the photoresist layer 44.

Then, still with reference to FIG. 8, the workpiece is subjected to a beam of N conductivity type ions, e.g., arsenic, e.g., at a dosage of $5 \times 10^{15}$ per cm$^2$ and an implantation energy of 40 KeV, for implanting the N type ions into the exposed WSi$_2$ layer 26a of the gate electrode structure 40. The ions do not penetrate entirely through the WSi$_2$ layer 26a and do not enter the underlying polysilicon layer 24a. Also, the ions do not penetrate the layer 42 and do not enter the substrate 12. Similarly, owing to the presence of the overlying photoresist layer 44, the ions do not enter into the WSi$_2$ layer 26a of the gate electrode structure 30.

Thereafter, the top masking layer 44 shown in FIG. 8 is removed and replaced with a masking layer which covers the ion implanted WSi$_2$ layer 26a of the gate electrode structure 40 while exposing the WSi$_2$ layer 26a of the gate electrode structure 30. This step is not illustrated because the workpiece appears exactly as shown in FIG. 8 except for the particular gate electrode structures being covered or exposed.

Then, the workpiece is again subjected to a beam of ions, but, in this step, P conductivity type ions, e.g., boron, at a dosage of $5 \times 10^{15}$ per cm$^2$, and with an implantation energy of 10 KeV. As with the N type ions, the P type ions enter only into the exposed WSi$_2$ layer 26a and not into the underlying polysilicon layer 24a or the silicon substrate 12.

At this point in the process, the processing of the WSi$_2$ layer 26 has involved patterning the layer 26 while undoped, thereby obtaining better patterning results than was achievable in the prior art process previously described. Also, after patterning, the WSi$_2$ layers 26a are implanted with ions while still preventing entry of the ions into unwanted portions of the substrate 12. Additionally, the ion dosages and energies used are comparable to those used in the described prior art process, whereby no additional expenses are incurred in the performance of the ion implantation.

As just explained, during the ion implantation of the WSi$_2$ layers 26a, the ions do not penetrate into the substrate 12. However, to form the source and drain regions of the MOS devices being made, it is necessary to introduce ions into the substrate. This can be done using conventional processing including forming the source and drain regions simultaneously while ion implanting the WSi$_2$ layers 26a. However, a preferred process for forming the source and drain regions is now described.

Figure 9:
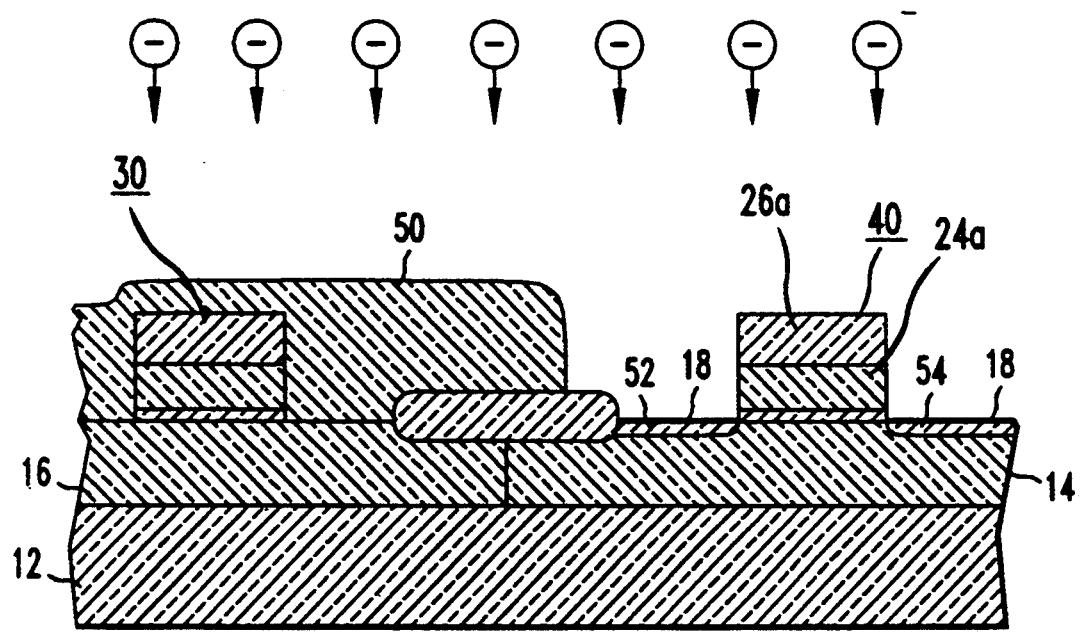

FIG. 9 shows the workpiece at the completion of a series of processes in which all the masking layers previously used are removed and the workpiece is covered with a patterned layer 50 of a photoresist. The layer 50 exposes the gate electrode structure 40 and portions of the surface 18 of the substrate adjacent to the electrode structure 40.

N type ions (e.g., arsenic) are then implanted into the exposed surface portions of the substrate to form doped regions 52 and 54 on either side of the gate electrode structure 40. The ions are implanted at a dosage of $5 \times 10^{15}$ per cm$^2$ and at an energy of 40 KeV. During the doping of the regions 52 and 54, the N type ions are also implanted into the WSi$_2$ layer 26a of the gate electrode structure 40. This merely adds to the quantity of previously implanted N type ions.

The workpiece is then heated, e.g., at a temperature of 875° C. for 30 minutes to cause diffusion of the implanted ions. The ions within the WSi$_2$ layer 26a diffuse into the underlying layer 24a of polysilicon and dope it to N type conductivity. The ions implanted into the substrate 12 diffuse laterally beneath the gate electrode structure 40 and form the source and drain regions of an NMOS transistor.

The process illustrated in FIG. 9 is then repeated using, however, a masking layer covering the gate electrode structure 40 and its adjoining source and drain regions while exposing the other gate electrode structure 30 and portions of the substrate surface 28 adjacent to the structure 30.

P type ions (e.g., BF$_2$) are then implanted, e.g., at a dosage of $5 \times 10^{15}$ per cm$^2$ and an energy of 40 KeV, and the workpiece again heated, e.g., at 850° C. for 20 minutes to dope the polysilicon layer 24a of the gate electrode structure to P type conductivity and to form P conductivity type source and drain regions of a PMOS transistor.

The temperature used during the diffusion of the boron ions to form the PMOS transistor is sufficiently lower than the temperature used to form the NMOS transistor, whereby little additional diffusion of the arsenic ions occurs during the diffusion of the boron ions.

A feature of the approach illustrated in FIGS. 8 and 9 is that in the fabrication of each type of MOS transistor, one ion implantation is used to dope the WSi$_2$ layers, and a separate ion implantation is used to form the source and drain regions. An advantage of this is that the doping parameters of the source and drain regions can be selected independently of those used for the WSi$_2$ layer, hence the parameters of the source and drain regions (e.g., dimensions and conductivities) can be optimized. This is particularly desirable when extremely shallow source and drain regions are desired. In such instance, relatively low ion implantation energies are required which are inadequate to obtain proper doping of the WSi$_2$ layers.

What is claimed is:

1. A method of fabricating a semiconductor device comprising the steps of forming, on a surface of a semiconductor substrate and in the named order, a first layer of a dielectric material, a second layer of undoped silicon, and a third layer of undoped tungsten disilicide, selectively patterning all said three layers to provide spaced apart first and second structures, each structure comprising said three layers, and each structure adjoining exposed surface portions of said substrate, doping said third layer of said first structure with P type ions while said third layer of said second structure is masked against said P type doping, doping said third layer of said second structure with N type ions while said third layer of said first structure is masked against said N type doping, and wherein, said doping with P type ions is performed by coating said first and second structures and said adjoining exposed surface portions with a first masking layer, selectively patterning said first masking layer for exposing said third layer of both said structures, covering both said structures, said exposed third layer of said structures and said adjoining exposed surface portions of said substrate with a second masking layer, selectively patterning said second masking layer for exposing said third layer of said first structure while leaving said third layer of said second structure and said adjoining surface portions masked by said second masking layer, and ion implanting said P type ions into said exposed third layer of said first structure.

2. A method according to claim 1 including, in said forming step, forming a fourth layer on said third layer, selectively patterning said fourth layer to provide each of said structures with a fourth layer overlying said third layer, said first masking layer also coating said fourth layer of both said structures, wherein said patterning of said first masking layer exposes said fourth layer of said structures, and selectively removing said fourth layer of said structures for exposing said third layer of said structures.

3. A method according to claim 2 wherein said first masking layer comprises a material selected from the group consisting of a photoresist and a glass.

4. A method according to claim 3 including partially removing said first masking layer for exposing said fourth layer by a reactive ion etching process.

5. A method according to claim 4 wherein said first masking layer comprises said photoresist and said fourth layer comprises silicon dioxide, and including monitoring the plasma used in said reactive ion etching process and stopping said process when silicon dioxide is detected in said plasma.

6. A method according to claim 4 wherein said fourth layer comprises silicon nitride, and including monitoring the plasma used in said reactive ion etching process and stopping said process when silicon nitride is detected in said plasma.

7. A method according to claim 3 wherein said fourth layer comprises silicon dioxide, and including selectively removing said fourth layer using a dilute hydrofluoric acid etchant.

8. A method according to claim 3 wherein said fourth layer comprises silicon nitride, and including selectively removing said fourth layer using a hot phosphoric acid etchant.

9. A method according to claim 1 wherein said first masking layer is thinner where it overlies said structures than where it overlies said adjoining substrate surface portions, and including removing successively exposed surface portions of said masking layer and stopping the removal process when the upper surface of said fourth layer of each of said structures is exposed.

10. A method according to claim 2 wherein said first and second structures extend upwardly from said adjoining substrate surface portions, and including providing said first masking layer initially as a fluid in a spin-on process for providing said first masking layer with said different thickness portions.

11. A method of fabricating a semiconductor device comprising forming, on a surface of a semiconductor substrate, first and second spaced apart structures each comprising, in the named order, a first layer of a dielectric material on the substrate surface, a second layer of undoped polysilicon, a third layer of undoped tungsten disilicide, and a fourth layer of a material selectively etchable with respect to said third layer, covering said structures and portions of said substrate surface adjacent to said structures with a first masking layer, providing first openings through said first masking layer for selectively exposing the upper surfaces of said fourth layers of both said structures, selectively removing, through said openings, said fourth layers thereby exposing the upper surfaces of said third layers of tungsten disilicide, covering said first masking layer, including said exposed upper surfaces of said third layers of tungsten disilicide, with a second masking layer, providing a second opening through said second masking layer for exposing said third layer of said first structure while said third layer of said second structure is covered by said second masking layer, and, in a first ion implantation step, implanting ions into said third layer of said first structure.

12. A method according to claim 11 including, after said first ion implantation step, performing a second ion implantation step for implanting ions into said third layer of said second structure while said third layer of said first structure is covered by a third masking layer.

13. A method according to claim 12 including, after said performing said first and second ion implantation steps, implanting ions into said adjacent substrate surface portions for forming doped regions within said substrate underlying said first and second structures.

14. A method according to claim 11 wherein said first and second masking layers are photoresist materials, and, prior to covering said first masking layer with said second masking layer, heating said first masking layer for hardening it.

15. A method according to claim 11 wherein said first and said second structure forming steps comprise successively depositing said first through said fourth layers in the form of continuous layers on said surface, said fourth continuous layer being a material selected from silicon dioxide and silicon nitride, covering said fourth continuous layer with an etch mask, selectively etching said fourth continuous layer to form said fourth layers of said first and second structures, and selectively etching said third through said first continuous layers to form said third through said first layers of said structures in successive etching processes wherein each of said formed layers is used as an etch mask in the formation of the layer immediately thereunder.

* * * * *